United States Patent [19]

Coteus et al.

[11] Patent Number: 5,461,455
[45] Date of Patent: Oct. 24, 1995

US005461455A

[54] OPTICAL SYSTEM FOR THE PROJECTION OF PATTERNED LIGHT ONTO THE SURFACES OF THREE DIMENSIONAL OBJECTS

[75] Inventors: Paul W. Coteus; Douglas S. Goodman, both of Yorktown Heights, N.Y.

[73] Assignee: International Business Machines Corporation, Armonk, N.Y.

[21] Appl. No.: 110,466

[22] Filed: Aug. 23, 1993

[51] Int. Cl.[6] ............................. G03C 5/00; G03B 27/42
[52] U.S. Cl. ............................. 355/43; 355/40; 355/46; 355/52; 355/53; 354/120
[58] Field of Search .................. 355/40, 43, 46, 355/52, 53; 354/120

[56] References Cited

U.S. PATENT DOCUMENTS 4,309,094  1/1982  Bollen ........................................ 354/80
5,001,038  3/1991  Dorinski et al. ........................ 430/311

FOREIGN PATENT DOCUMENTS 3183115  8/1991  Japan.

OTHER PUBLICATIONS

IBM Tech. Disc. Bull.—Van Yechten—vol. 27 No. 11 Apr. 1985 pp. 6678–6680.

Primary Examiner—Michael L. Gellner
Assistant Examiner—Daniel P. Malley
Attorney, Agent, or Firm—Daniel P. Morris; Alvin J. Riddles

[57] ABSTRACT

An image projection system for all surfaces of a three dimensional object such as a polyhedron in which direct and angle reflected image patterns are projected from superpositioned non-overlapping mask patterns mounted on different levels where the separation of the levels is related to the size of the object. The apparatus and process permits simultaneous photolithigraphic printing of conductors on the top and all sides of a cube shaped stack of integrated circuit chips.

18 Claims, 4 Drawing Sheets

OPTICAL SYSTEM FOR THE PROJECTION OF PATTERNED LIGHT ONTO THE SURFACES OF THREE DIMENSIONAL OBJECTS

FIELD OF THE INVENTION

The invention relates to the projection of patterned light such as images onto the surfaces of three dimensional objects and in particular to the projection of patterns for lithographical electrical conductor formation purposes on the surfaces of solid state electronic apparatus.

BACKGROUND AND RELATION TO THE PRIOR ART

In producing a three dimensional object, such as a polyhedron where it is desirable to provide patterns on different surfaces for photoresponsive operations, it would be of advantage to produce a pattern on each surface without having to reposition the object. A particular illustration is in the field of solid state electronic apparatus where the wiring, for a plurality of integrated circuit members that have been assembled into a stack having an overall polyhedron shape, is formed on the surfaces of the polyhedron. The standard way in the art of forming such wiring is by the separate projection or contact printing, for subsequent photolithographic conductor formation of an image of the wiring for each individual surface, on that respective surface. Where there is a high conductor density and interrelationship of conductor patterns from surface to surface, the problems of the positioning in registration of the surfaces of the polyhedron shaped integrated circuit stack for separate photolithographic conductor formation on each surface requires meticulous attention and adds to cost in manufacturing.

There has been some activity in the electronic apparatus field photolithographic accommodation of three dimensional features and consideration.

In U.S. Pat. No. 5,001,038, in the printed circuit manufacturing field, differences in surface level are accommodated by using different masks for different levels relative to a reference plane.

In Japanese Patent document 3 183115 A the considerations of flaws in mask patterns in the semiconductor manufacturing field is accommodated by superimposing more than one mask in an optical path to be projected onto a substrate. It would be of advantage to be able to project an image on each surface of a three dimensional object simultaneously and without having to reposition the object.

SUMMARY OF THE INVENTION

The invention is a technique of projecting light patterns for such photosensitive reactions as chemical changes, photodeposition and ablation.

Image projection is provided for all surfaces of a three dimensional object through an optical system wherein light passes through a mask pattern for each surface, the light through the mask patterns is focused on each surface, angled mirrors project images to other than direct projection surfaces, and multiple planar focal levels are produced so that mask patterns can be mounted in essentially non-overlapping superimposed relationship. The simultaneous patterning of the conductors for the top and all sides of a polyhedron shaped stack of integrated circuits is described.

BRIEF DESCRIPTION OF THE DRAWINGS

FIGS. 8, 9 and 10 are schematic illustrations of the use of a separate angled mirror for each planar surface of a side of an object: wherein FIG. 8 illustrates the use of an additional angled mirror at a different unfolded image level, FIG. 9 illustrates an additional mask level for the additional image level of FIG. 8, and, FIG. 10 illustrates the use of an additional angled mirror focused to the same unfolded image level.

DESCRIPTION OF THE INVENTION

The invention makes possible the projection of an image on each surface of a three dimensional object. Projection is direct for the top surface and through angular reflection for other surfaces. In accordance with the invention, illumination passes through a mask assembly having the characteristics that the pattern for the top surface of the object is positioned at an upper level, that the mask patterns for the other surfaces are positioned on at least one lower level, closer to the object and separated from the upper level by a distance related to the height of the object and to the lens, and, that light that passes through the mask pattern on the upper level does not pass through any mask patterns on the lower level. The light through the mask patterns is focused directly on the top surface of the object in the case of the light from the upper level mask pattern and in the case of light through the lower level mask patterns, through an assembly of angled mirrors. The mask pattern for direct projection is preferably in the vicinity of the center of the unfolded image of the object.

The invention is illustrated in connection with the surfaces of a polyhedron although in the light of the principles set forth one skilled in the art will readily envision their application to other three dimensional shapes.

The elements of the invention are illustrated in connection with FIG. 1 which is a schematic representation of the the mask pattern locations and the light paths for the simultaneous projection of an image pattern on the top surface and on one of the side surfaces of an object.

Figure 1:
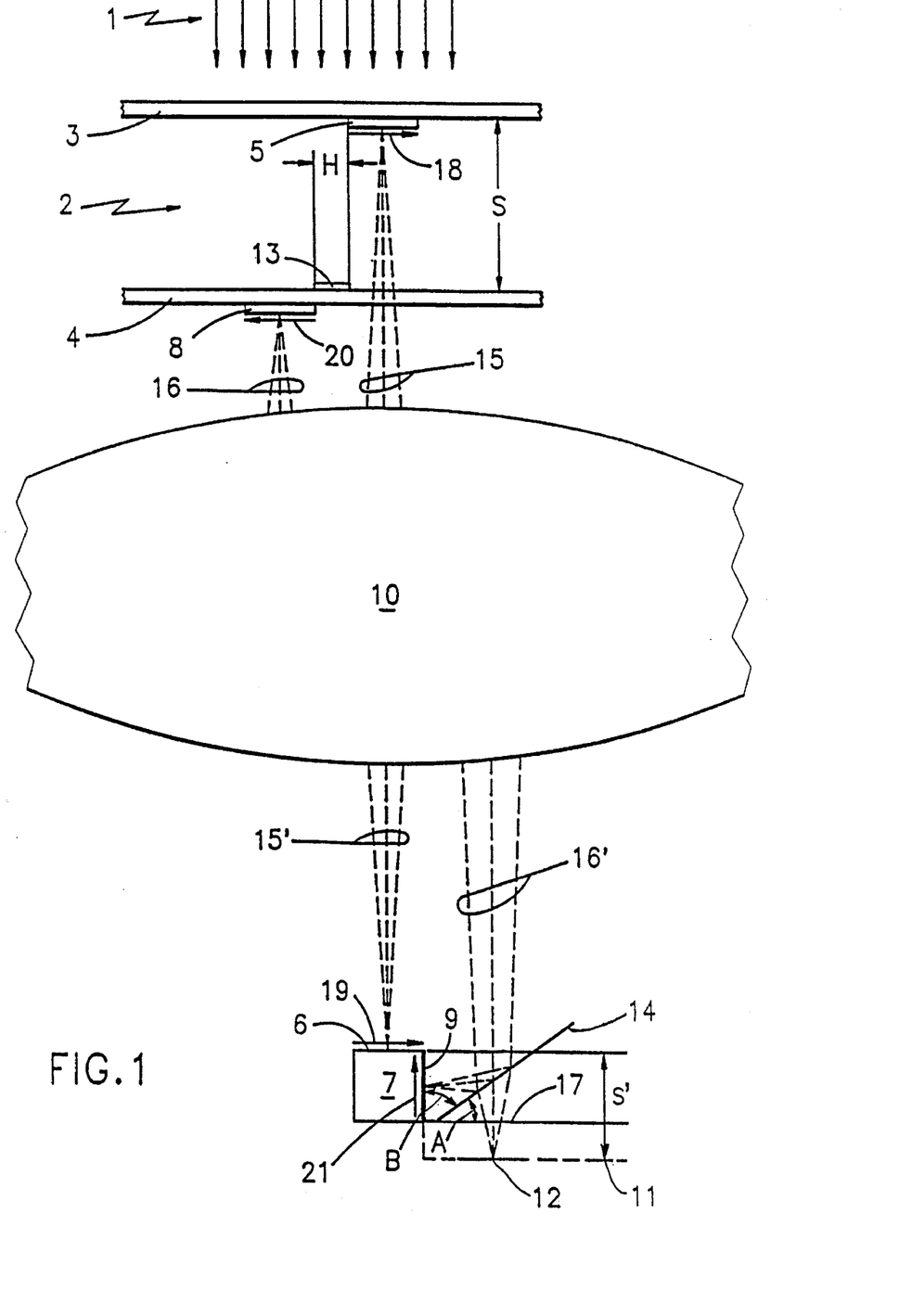
FIG. 1 is a schematic representation of the relative relationship of the surfaces of the object, the image patterns, and the paths of light in the projection system of the invention.

Referring to FIG. 1, light 1 from a matched illumination system as is well known in the art, provides relatively telecentric illumination through a mask assembly 2 having an upper level 3 and a lower level 4. The material at the levels 3 and 4 is transparent and supports the mask patterns. The mask assembly has a mask pattern 5 for the top 6 of the object 7 and a mask pattern 8 for the side 9 of the object 7. The mask pattern areas are the size of the areas to be projected on the object as adjusted through any lens.

The mask assembly 2 has a first characteristic that the vertical separation dimension S between the levels 3 and 4 corresponds to the dimension S' from a reference level 11 on the object side of the lens, which is the focus level for the unfolded image 12 of the object 7, to the top 6 of the object 7.

The mask assembly 2 has a second characteristic that the horizontal displacement of the mask patterns 5 and 8 be such that light that passes through the mask pattern 5 that is closer to the light 1 cannot also pass through a mask pattern 8 that is farther from the light 1. The horizontal displacement is shown as dimension H. In practice where S is small and there is little spreading of light from mask pattern 5 the mask patterns can be adjacent but not overlapping. An H sized opaque region 13 can be deposited on the level 4 to prevent light that passed through the upper mask pattern 5 from also passing through the lower mask pattern 8. the dimension H is also selected so that light to be reflected from the angled mirror 14 for focusing on the side 9 of the object 7 does not strike the top 6 of the object 7.

The light that passed through the mask patterns 5 and 8 is projected respectively directly to a focus on the top 6 and through reflection from angled mirror 14 to focus on the side 9.

In the illustration of FIG. 1 the projection is through a lens labelled element 10.

The lens 10, is positioned to focus the light that passed through the mask pattern 5 on the top surface 6 of the object 7. An illustrative ray bundle from a single point of the light that passed through the mask pattern 5 is labelled element 15 with the corresponding ray bundle coming from the lens 10 being labelled element 15'. An illustrative ray bundle from a single point of the light that passed through the mask pattern 8 is labelled element 16 with the corresponding ray bundle coming from the lens 10 being labelled element 16'.

The lens 10 is of the type known in the art as "afocal", "doubly telecentric" in which the ray bundles that enter parallel to the lens axis leave parallel to the lens axis.

The ray bundle 16' is focused on the unfolded image 12 of the side 9 and is reflected from an angled mirror 14 to focus on the side 9 of the object 7. The angle A that the angled mirror 14 makes with the reference level 17 is the same as the angle B that the angled mirror 14 makes with the side 9 of the object 7. In other words the angled mirror forms equal angles with the surface to which the reflected light is to be focused and with the reference level 17, which in this illustration is the level of the bottom of the object.

There is a pattern reversal with each reflection from a angled mirror. This is illustrated as an arrow 18 for the mask pattern 5 and an arrow 19 in the same direction for the direct projection on the top 6 of the object 7; and as an arrow 20 for the pattern 8 with an opposite direction arrow 21 for the side 9 after reflection from the angled mirror 14. The mask patterns 5 and 8 are written on transparent supporting members for levels 3 and 4 by standard electron beam or other lithography which can accommodate any pattern reversal or relative size requirement.

The angled mirror 14 is generally larger than the unfolded image of the size of the object. It should be large enough to capture the necessary light for the reflection. It is positioned adjacent to the object 7 but separated for clearance in positioning of the object 7 and where needed accommodation of any obstruction of the light to be reflected by the angled mirror by the top portion 6 of the object 7.

Figure 2:
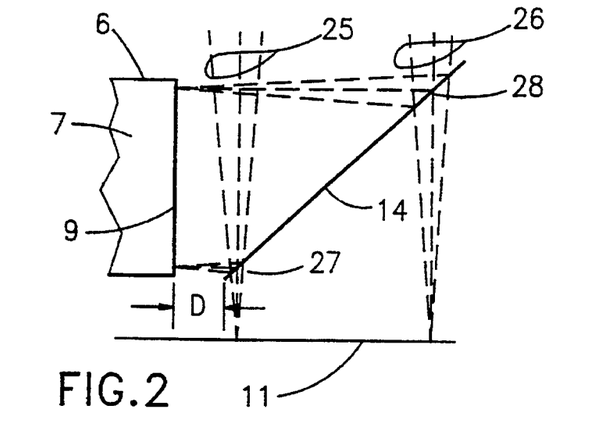
FIGS. 2, 3 & 4 are schematic representations of the optical considerations in the size, the shape and the positioning of the angled mirrors.

Referring to FIG. 2 there is a shown a schematic representation of a side view of a portion of the object 7 at side 9 positioned adjacent the angled mirror 14 with the reflection considerations of lower and upper ray bundles 25 and 26 such as element 16' of FIG. 1.

In FIG. 2 the angled mirror 14 is separated a distance D from the side 9 of the object 7 to permit positioning clearance of the object 7 and or the mirror 14 and, where needed, to accommodate any obstruction of the light to be reflected by the mirror 14 by any portion of the object 7, In FIG. 2 this would occur if the ray bundle 25 were to be at an angle that would permit it to strike the top 6.

The positioning clearance provided by the distance D is useful where the object is inserted from below into an angled mirror assembly for several sides of an object. The mask patterns corresponding to the mask pattern 8 of FIG. 1 are shifted an equivalent distance in the opposite direction the distance D.

The ray bundle 25 subtends the smallest area 27 on the portion of the angled mirror 14 closest to the side 9 whereas the ray bundle 26 subtends a larger area 28 at the greater distance from the side 9. As the distance from the side of the object to the portion of the angled mirror becomes greater, the area becomes larger and changes shape. The angled mirror 14, to accommodate the needed reflecting area, is wider at the portion that is farthest from the surface where the reflection is to be projected.

Figure 3:
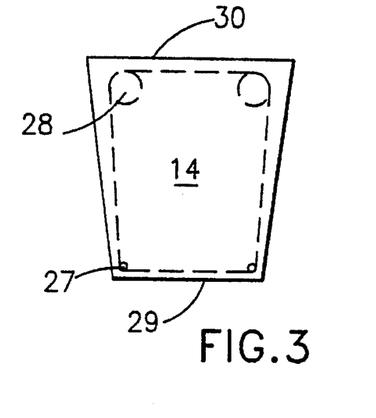

Referring to FIG. 3 a schematic representation illustrates the shape of the minimum needed reflecting area for ray bundles at the four corners of the side 9. The diagonal mirror 14 has a shorter edge 29 proximate to the side 9 and the longer edge 30 more remote from the side 9. The maximum needed reflecting area is the area within the dotted line around the areas corresponding the areas 27 and 28 in FIG. 2.

Figure 4:
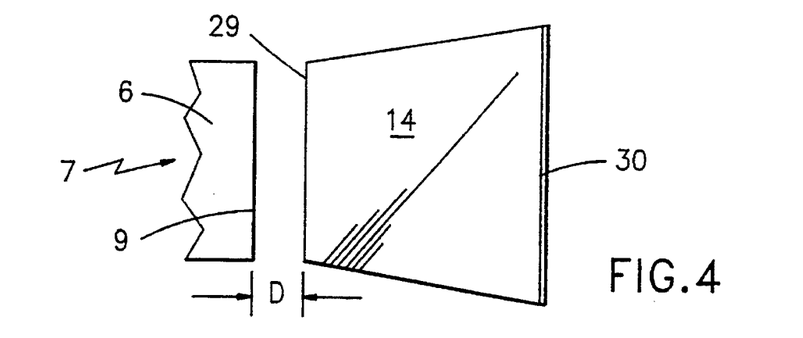

In FIG. 4 there is shown a top view of a schematic representation of the top 6 of the cube shaped object 7 of FIG. 2. In FIG. 4 the angled mirror 14 is positioned with the side 29 adjacent to but separated from the side 9 of the object 7 by the distance D.

Figure 5:
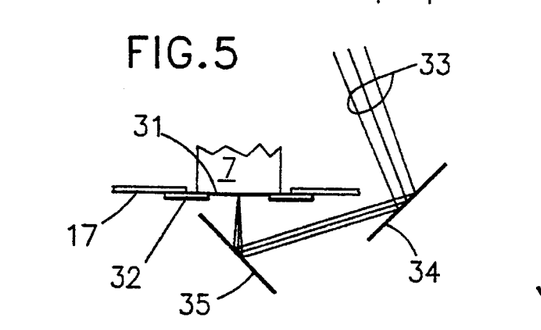
FIG. 5 is a schematic representation of the use of two angled mirrors in the projection of a image on the underside of an object.

In FIG. 5 schematic representation is provided that illustrates the use of two angled mirrors in projecting an image on the undersurface of an object. In doing this a small portion of the undersurface needed for support cannot be imaged.

Referring to FIG. 5 the object 7 is provided with support that retains the undersurface 31 of the object 7 at the reference level 17 while leaving most of the undersurface 31 exposed for image projection. An example support is illustrated as extending portions of support element 32 that supports the object at the level 17 and which extend a small distance under the object 7 at an opening. A ray bundle 33 is reflected serially, from a first angled mirror 34 preferably positioned below the reference level 17, and a second diagonal mirror 35 receiving the reflected light from angled mirror 34 and positioned for focusing that light on the exposed undersurface 31 of the object 7. Since there are two serial angled mirror reflections the mask pattern orientation will undergo a double reversal and be the same as that in the mask pattern in the mask assembly 2. The mask pattern for the underside 31 is positioned separately from the mask pattern 8 on the same lower level 4 as the mask pattern 8 in the mask assembly 2.

Figure 6:
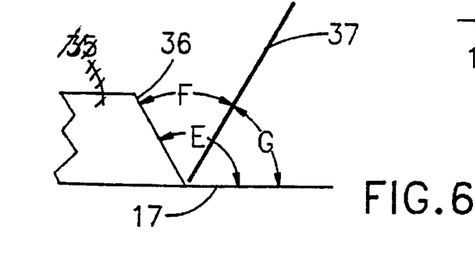
FIGS. 6 and 7 are schematic illustrations of the angled mirror positioning and light paths where the sides of the object are not perpendicular to a reference level.

In situations where the sides of a polyhedron shaped object are not perpendicular to the reference level, the angled mirror is positioned with the angle formed by the angled mirror and the side of the polyhedron being equal to the angle formed by the angled mirror and the reference level. An example is illustrated in the schematic representation in FIG. 6 where the object side 36 forms an angle E with the reference level 17. The angled mirror 37 is positioned so that angle F is equal to angle G.

Figure 7:
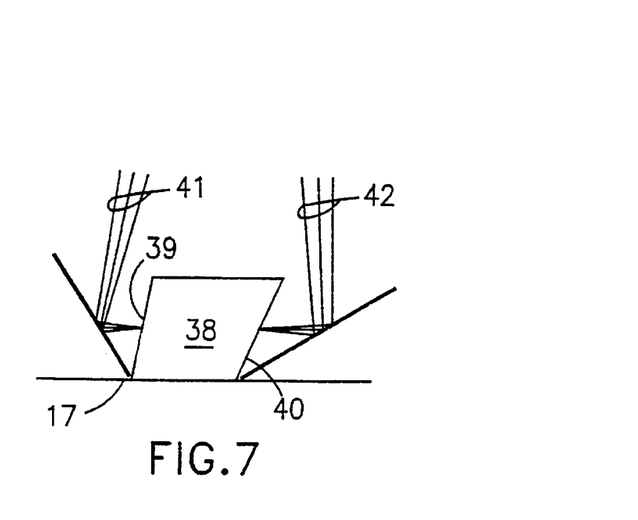

In situations where there are sides of the object that form different angles with the reference level, the angled mirror for each side is positioned so that the angles between the mirror and the side and the angles between the mirror and the reference level are equal for the particular side. A separate mask pattern positioned on the same lower level of the mask assembly is employed for each side. The situation is illustrated in FIG. 7 where, in a schematic representation, the object 38 has a side 39 that forms a different angle with the reference level 17 than the angle formed by the side 40 of the same object 38 with the level 17. Both the angles are at other than 90 degrees to the reference level 17. The example ray bundles 41 and 42 to the surfaces 39 and 40 respectively are each projected through separate mask patterns, not shown, positioned on the same level 4 of the mask assembly 2 in FIG. 1.

At least one separate angled mirror is employed for each side or planar surface and a choice is available of positioning the mirrors with different image planes or positioning the mirrors with the same image plane at the reference level. The choice is illustrated in connection with FIGS. 8,9, and 10.

Figure 8:
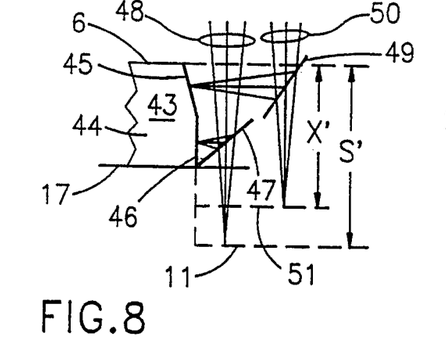

Referring to FIG. 8 the use of a separate angled mirror with a separate image plane for each planar surface of a side is illustrated. In FIG. 8 an object 43 has a side 44 with a planar surface 45 and another planar surface 46. A first angled mirror 47 is positioned so that a ray bundle 48 focused on the reference level 11 as an image plane will have the light therefrom reflected from the mirror 47 to focus on the surface 46. A second angled mirror 49 is positioned so that a ray bundle 50 focused on a plane 51 as a separate image plane will reflect the light to focus on the surface 45. The distance from the top 6 to the image plane 51 is labelled X' and is less than S'.

Figure 9:
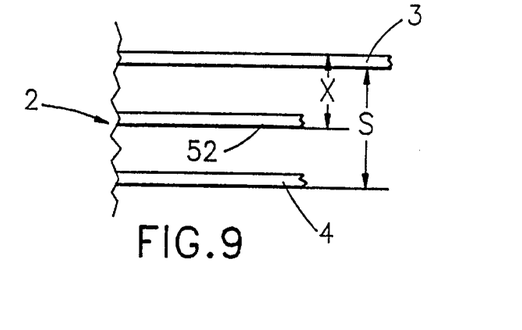

Referring to FIG. 9 the effect of the image plane 51 on the mask assembly 2 is shown. In FIG. 9 separate mask patterns are provided for the light paths represented by ray bundles 48 and 50 but since there is a separate image plane 51 there must also be a separate mask pattern level in the mask assembly 2. The additional mask pattern level 52, being within the overall height, dimension S' in FIG. 8 and S in FIG. 9, of the object 43, will be positioned in the mask assembly 2 at a level 52 at a height dimension X' in FIG. 8 and X in FIG. 9, between the levels 3 and 4.

Figure 10:
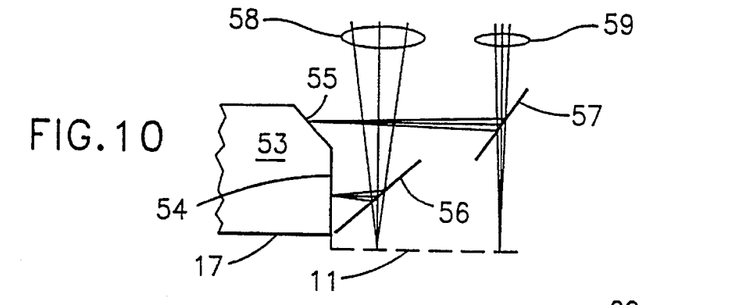

The second choice in the situation where there is more than one planar surface on a side is to have two angled mirrors in an arrangement where the light to each is focused on the same image plane. This choice is illustrated in FIG. 10. In FIG. 10 an object has a side 53 with a one planar surface 54 and another planar surface 55. A first angled mirror 56 is positioned so that a ray bundle 58 focused for example on the unfolded image level 11 as an image plane has the light therefrom reflected from the mirror 56 to focus on the surface 54. A second angled mirror 57 is positioned so that a ray bundle 59 is also focused on the same reference level 11 as an image plane but positioned so that the light reflected is focused on the surface 55. Separate mask patterns are provided for the light paths represented by ray bundles 58 and 59. Since the image plane is the same, the mask patterns for each are positioned on the same lower level 4 of the mask assembly 2 in FIG. 1.

The choices provide flexibility in arranging the optical components on the apparatus. In general a preferred embodiment would be to have as few mask levels as possible. In an image projecting optical system where only projection on the sides of an object through angled mirrors is involved all masks could be on a single level.

An advantage of the optical system of the invention is the amount of light delivered at the edges of intersecting surfaces. At the intersections of the sides with the top, of the sides with the underside and the sides with each other, the light coming from both the projections on the intersecting surfaces is additive at the intersection. The light projected to a surface has some light spilling past the edge so that the spilling light at two intersecting surfaces results in increased light power at those regions. This advantage is particularly useful where the intersection has features that scatter light and in photolithography where photoresist material tends to be thinner at edges where the surface changes direction.

There is considerable flexibility in the arrangement of the elements and the materials employed in the mask assembly, element 2 in FIG. 1. The considerations are illustrated in connection with FIGS. 11,12 and 13. In general the mask assembly has two levels separated by the dimension S which corresponds to the dimension S' which is related to the distance from the unfolded image plane to the top of the object. The mask patterns are supported by transparent supporting members that place the pattern at the proper position in the optical system.

Figure 11:
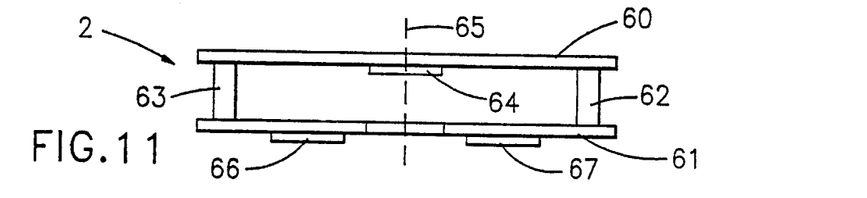
FIGS. 11, 12 and 13 are schematic illustrations of the positioning of the image patterns in the mask assembly member.

Referring to FIG. 11, the assembly 2 has an upper transparent support member 60 and a lower transparent support member 61 that correspond to the levels 3 and 4 in FIG. 1 and which are maintained in superimposed position by spacers 62 and 63. The transparent support members 60 and 61 may be glass. An mask pattern 64 to be directly projected onto the top of the object is applied to one side of the upper support member 61 in an identified location so that the assembly 2 can be positioned with the light through that mask pattern registered with the top 6 of the object 7. In FIG. 11 the identification locating member is symbolically shown dotted as line 65 and an opening in support member 61 around the location under the mask pattern 64 reduces losses from reflection and reduces stray light.

The mask patterns for the lower level of the assembly 2, which level has the mask patterns for images that will be projected through reflection from angled mirrors, and which patterns are projected to the sides and underside of the object are applied to the support member 61 on the same side as that used for element 64 on support member 60. For this illustration two mask patterns 66 and 67 are shown. The patterns 64,66 and 67 are applied using standard techniques in the art of electron beam or other writing. The mask patterns that will have a single or an odd number of angled mirror reflections are written with the orientation reversed from that of the mask pattern for direct projection. The mask patterns are positioned, spaced horizontally on the support member 61 so that no light that passed through the mask pattern 64 can also pass through either or both of mask patterns 66 and 67.

The presence of particles on the mask pattern and light scattering can affect the resolution and cause defects in the projected image. The use of shields, not shown, known in the art as pellicles, surrounding the mask area above and below elements 60 and 61 is helpful in limiting defects. Light reflection can be reduced with antireflective coatings on surfaces, or, providing openings in one support member to permit light to or from a mask pattern on the other support member to pass.

Figure 12:
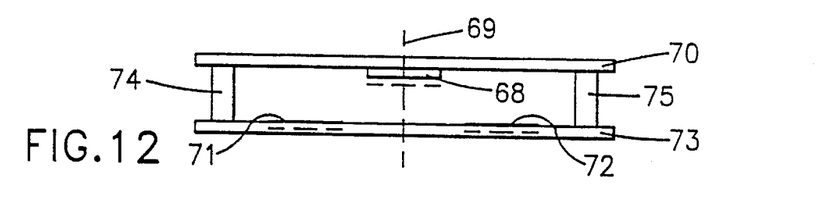

Referring to FIG. 12 there is illustrated a mask assembly where the mask patterns are all positioned internally. The image mask pattern 68 centered on the indicator 69 and which is to be directly projected on the top of the object is applied to the under or inside surface of support 70. The image mask patterns 71 and 72 that are to be projected through reflection from an angled mirror are applied in a reverse orientation from the orientation of pattern 68 to the upper or inside surface of support 73. With the structure of FIG. 12 greater control of the presence of particles can be achieved. The optically apparent positions of the mask patterns, shown dotted, need to be taken into consideration in focusing and alignment.

In a situation where it is advantageous to be able to write all mask patterns on a single surface, certain mask patterns can be given apparent positions that provide the vertical separation for dimension S. This situation is illustrated in FIG. 13.

Figure 13:
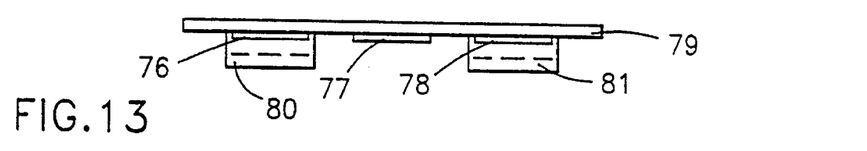

Referring to FIG. 13 the mask patterns 76,77 and 78 are written on the same undersurface of the transparent support member 79 corresponding to level 3 of FIG. 1. Optical shifting material such as blocks of quartz 80 and 81 can be positioned over the mask patterns 76 and 78 to move the apparent image of those mask patterns to an apparent level corresponding to the lower level 4 of FIG. 1, or to an in between level corresponding to level 52 in FIG.9.

While the optical considerations of positioning mask patterns and angular mirrors for single light path reflection to a surface have been emphasized for simplicity and explanation clarity it will be apparent to one skilled in the art that the principles of the invention are readily extendable to the use of beam splitting mirrors to divide the light from a single mask pattern to be projected on more than one surface.

Figure 14:
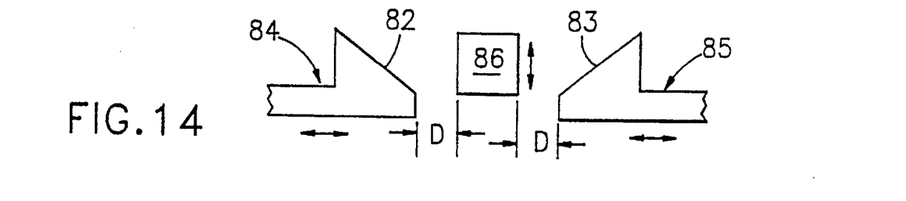
FIG. 14 is a schematic illustration of the shape and movement of apparatus elements.

The light pattern projecting system of the invention is readily translatable to a process and apparatus for performing image projection onto the top and side surfaces of objects. The angled mirrors can be mounted on or coated on horizontal travel and registration facilitating members that have angular faces and, orthogonal thereto, a vertical travel loading and positioning member for replaceably mounting the work object is arranged. The features are illustrated in FIG. 14 wherein angled mirrors 82 and 83 are mounted on, or coated on in the case of a polished surface, fixture members 84 and 85 respectively, each adapted for movement in the horizontal direction with travel toward each other stopped at the distance D from the object 86. The object 86 is mounted on a support means that permits the vertical movement of the object as shown by the arrow, for the insertion and withdrawl of the object at the workstation.

System alignment can be accomplished by an operator moving the upper mask pattern support plate to establish axis alignment and then by moving the lower mask pattern support plate so as to center the reflected projection on the respective side. The alignment is facilitated when used with a dichroic mirror and with a fluorescent coating on the alignment sample sides that produces a longer wavelength light that can be viewed by the operator through the dichroic mirror.

The invention has been illustrated in detail with respect to a cube shaped polyhedron, but in the light of the principles set forth one skilled in the art will be able to apply those principles to other three dimensional shapes such as a cylinder and a pyramid. In the case of the cylinder, the length would be the dimension S' the angled mirror would be frusto-conical in shape surrounding the object, and the mask pattern would be positioned on the lower level of the mask assembly in a circle surrounding the area used for the direct projection onto the top of the cylinder through a mask pattern positioned on the upper level of the mask assembly. In the case of the pyramid, the height from the base to the point would be the dimension S' and a choice would be available in the form of a direct projection through a single mask pattern positioned on the upper level of the mask assembly onto all diagonal sides of the pyramid an angled mirror projection to each side of the pyramid of reflected light that had passed through separate mask patterns positioned on the lower level of the mask assembly for each pyramid side.

Figures 15, 16, 17:
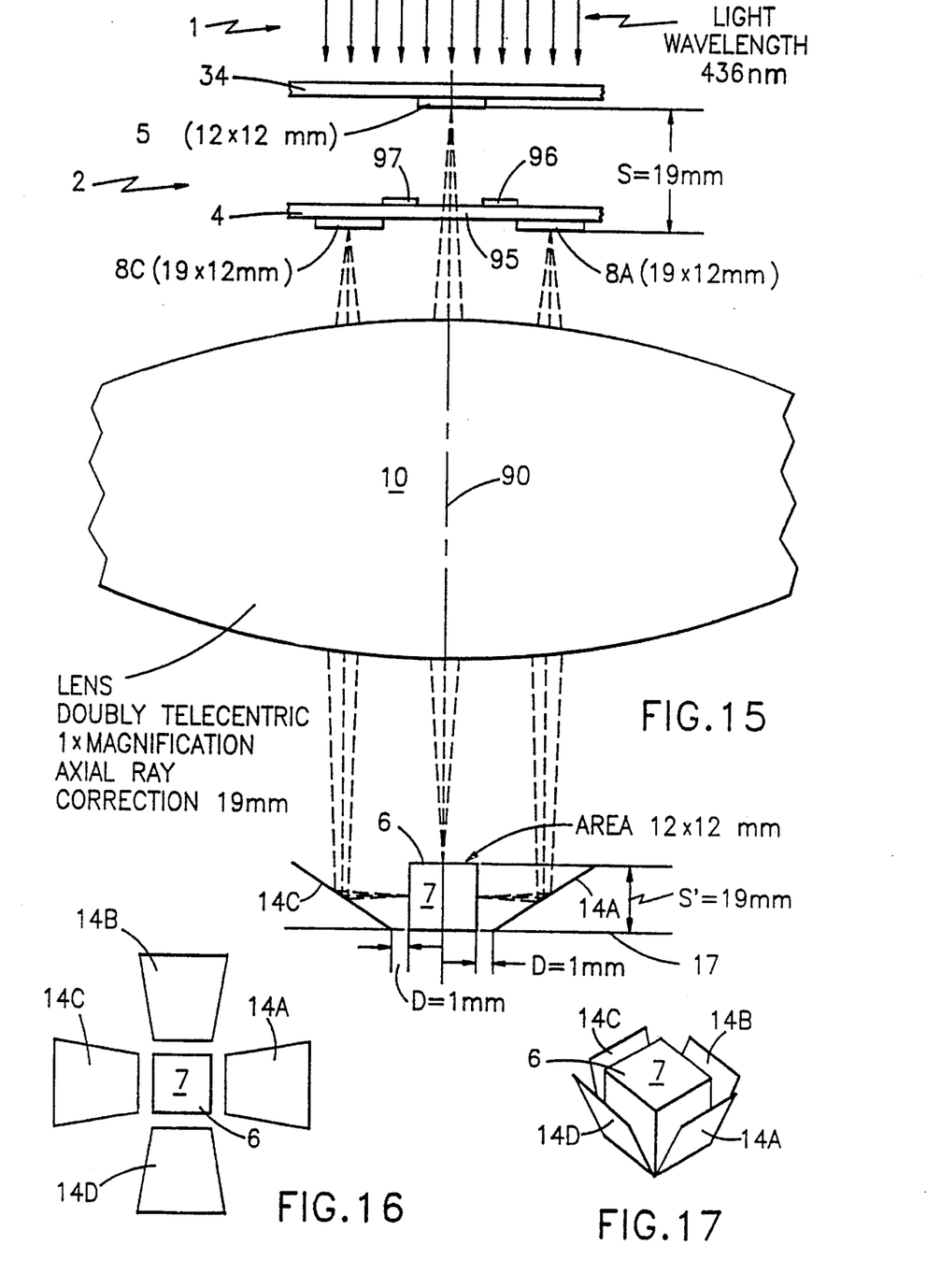
FIG. 15 is a side view of a schematic illustration of the relative relationship of the elements of the system of the invention in the simultaneous projecting of an image on each of the top and four sides of a stacked package of integrated circuits.
FIGS. 16 and 17 respectively are a top view and a perspective view of the angled mirror assembly of FIG. 15.

To provide a starting place for one skilled in the art in practicing the invention there is provided in connection with FIGS. 15, 16 and 17, an example image projection of a 50 micron line and separation width, conductor pattern, on the top and four sides of a cube shaped package of stacked interconnected planar integrated circuits. The cube package has a top surface area of 12×12 millimeters (mm) and a height dimension of 19 mm. In such integrated circuit chip packaging the chips are about 1.5 mm thick fused in a stack. The interconnecting conductors are brought out to the chip edges forming a matrix of connecting pads with about 50 micron width and separation on the 19×12 mm sides of the package. The top surface is generally used for package to package interconnection with a similar connecting pad size.

The integrated circuit stack object is coated with a photolithographic material standard in the art that is to be used to produce, when exposed and developed, either a positive or negative pattern for standard conductor formation.

In such a package as the line width and separation becomes narrower, it becomes of substantial benefit if the conductor patterns for all four sides and the top of the cube shaped object can be simultaneously projected exposing the resist at a single registration and alignment.

FIG. 15 is a side view of a schematic illustration of the projection system as described in the earlier figures showing features that facilitate the example. FIG. 16 is a top view of the object and angled mirror assembly of FIG. 15. FIG. 17 is a perspective view of the object and angled mirror assembly of FIG. 15.

Referring to FIGS. 15, 16 and 17, using as many of the same reference numerals as would be clear for the elements as in FIG. 1; in the side view of the illustration in FIG. 15, the example stacked chip package is the object 7, the angled mirror 14 A–D assembly, the lens 10 and the mask assembly 2 are aligned around the central axis 90 with the 19 mm height of the object 7 corresponding to the dimension S' of FIG. 1. The top surface 6 of the object 7 is an area 12×12 mm. The angled mirrors 14A–14D are assembled around all four sides of the object 7, of which two, 14A and 14C, are visible in the side view. The angled mirrors are offset 1 mm for object insertion and light beam obstruction clearance. The offset is the distance D of FIGS. 2 and 4. Since the object 7 is a cube the angled mirrors are at 45 degrees to the surface 17 which becomes the level of the unfolded image of the sides.

The total field size is the unfolded image of all sides including the offsets as shown in FIG. 16. A satisfactory total field size dimension for projecting the images is about a 72 mm diameter circle. In a field of that size an area with about 1000×1000 pixels or about $10^6$ would be needed. The present state of the semiconductor chip art, photolithography apparatus provides over $10^8$ pixels. A, standard in the art, light wavelength of 436 narometers (nm) is satisfactory for the 50 micron resolution of the example.

The lens 10 is of the type known as "afocal", "doubly telecentric" in which the ray bundles are parallel to the axis 90 on both surfaces of the lens. Constant (1×) magnification provides the advantage that the same mask scale can be used for the mask patterns in the mask assembly 2 and the images projected on the surfaces of the object 7.

The 12 mm×12 mm area mask pattern 5 on the underside of level 3 of mask assembly 2, and the 12 mm×19 mm area mask patterns 8 A,B,C,& D on the underside of level 4, of which only 8A and 8C are visible in the FIG. 15 side view, are applied by the technique of electron beam patterning of a standard layer of chromium on glass supporting members.

The orientation of the 8A–8D mask patterns is reversed from that of mask pattern 5 due to the image reversal that occurs through the angled mirror 14A–D reflection.

The hole 95 in the support member at level 4 is large enough to prevent any obstruction of the light through the mask pattern 5. Opaque elements 96, 97, 98 and 99, of which only 96 and 98 are visible in the side view, are positioned on the upper side of the support member of level 4 to insure that no light that passed through mask pattern 5 can also pass through mask patterns 8A–D; they serve the purpose of the dimension H and include any mask pattern shift required by the offset distance D.

At the present state of the art some modification of existing commercially available tooling would be required. A commercially available projection system is the TAMARACK Model 162 which has a working dimension between the lens and the object sufficient for the areas required in the example, and it also provides 15 micron resolution and a 150 mm field. It would however be necessary to modify the apparatus by changing to an afocal, doubly telecentric lens.

What has been described is the projection of images on all surfaces of a three dimensional object using direct and angled reflected images from mask patterns mounted on different levels determined by the size of the object.

Although the invention has been described with reference to lithographic applications, it is not limited thereto and is generally applicable to the projection of a pattern of electromagnetic radiation. Examples of other applications are ablation, photoactived vapor deposition and processes activated by electromagnetic radiation. This list is exemplary only and not limiting.

While the invention has been shown and described with reference respect to specific embodiments, it will be understood that it is not thus limited. Numerous modifications, changes and improvements will occur which fall within the scope and spirit of the invention.

What is claimed is:

1. An optical system for image projection on multiple surfaces of a three dimensional object having at least a top portion, a base portion, and at least one surface therebetween, comprising:

a light source, an image mask assembly member, a focusing means member and a reference location in structurally related positions so that light from said light source passes serially through said image mask member, through said focusing means member onto said object positioned with said bottom portion thereof on said reference location, said image mask member supporting, at least one of a direct projection orientation first type mask image pattern, and a reflected projection orientation second type mask image pattern, in separated relationship, whereby light passing through one of said first and said second type image patterns cannot pass through the other of said first and said second type image patterns, said focusing means member being adapted to separately focus light that passed through said first type mask image pattern onto said top portion of said object and, light that passed through said second type mask image pattern to a location adjacent said object, and, a light reflecting assembly member positioned adjacent to said object and adapted to reflect light that passed through said second type mask image pattern and through said focusing means member, to at least one said surface between said top and said bottom portions of said object.

2. The optical system of claim 1 wherein said said focusing means member is a lens.

3. The optical system of claim 2 where said image mask member is a superimposed structure of first and second transparent support layers said first layer being nearest said light source and supporting said direct projection orientation first type mask image pattern and said second layer supporting said reflected projection orientation second type mask image pattern, the distance between said first and said second image patterns being the vertical distance from the focus level of the unfolded image of said object and said top portion of said object.

4. The optical system of claim 3 where said light reflecting assembly member is at least one angled mirror surface positioned to reflect light from said focusing means member to said at least one surface between said top portion and said bottom portion.

5. The optical system of claim 4 where the center of said direct projection orientation first type mask image pattern, said lens and the centerline of said object are in a line.

6. The optical system of claim 4 where said object is a polyhedron.

7. The optical system of claim 6 where said polyhedron is a cube.

8. In the projection of images onto the surfaces of a three dimensional object the improvement comprising the simultaneous use of to projection and angled mirror reflection of light to selected surfaces of said object from horizontally disposed mask patterns.

9. In the projection of images onto the surfaces of a three dimensional object the improvement comprising the combined use of:

direct projection through a mask pattern onto the top of said object, and, angle reflected projection through individually positioned mask patterns for selected surfaces.

10. The process of projecting images onto the surfaces of a three dimensional object comprising in combination the steps of:

focusing light through a mask with a first orientation directly on a portion of an object, and simultaneously, focusing light through at least one mask with a different orientation from said first orientation reflected through an angled mirror to a different portion of said object.

11. An optical system for image projection on multiple portions of a three dimensional object having a top, a bottom and at least one side portion, comprising:

a light source, an image mask assembly, an afocal, doubly telecentric, lens, and a reference level in structurally related positions whereby light from said light source passes serially through said image mask assembly, and through said lens onto said object positioned with said bottom on said reference level, angled mirror reflection means positioned on said reference level adjacent said object and adapted for reflecting light that passed through said lens to said at least one side portion of said object, and, said image mask assembly having at least one transparent supporting level with at least one of direct orientation and reflecting orientation image mask patterns thereon.

12. The optical system of claim 11 wherein said image mask assembly has a first and second superimposed transparent image mask supporting levels.

13. The optical system of claim 12 wherein said first of said superimposed transparent supporting levels supports a direct projection oriented image mask pattern and, said second transparent supporting level supports a reflecting projection oriented image mask pattern and is separated from said first transparent supporting level by a dimension related to the height of said object.

14. The optical system of claim 13 wherein said lens focuses light through a mask pattern on said first level of said mask assembly on said top portion of said object.

15. The optical system of claim 11 including means wherein light through a plurality of separate mask patterns is conveyed to a separate angled mirrors in said reflecting means.

16. The optical system of claim 12 wherein said object said lens, and said image mask assembly are aligned on an axis.

17. The optical system of claim 16 wherein said object is a cube 12×12×19 mm positioned on one 12×12 mm surface with 12×18 mm sides parallel to a 19 mm linear dimension aligned with said axis, the displacement between said first and said second levels of said mask assembly is 19 mm, said lens has 1× magnification and the wavelength of said light is 436 nm.

18. The process of projecting images onto the surfaces of a three dimensional object comprising in combination the steps of:

illuminating, with light that passes through, in a respective serial arrangement, a mask assembly, and a lens, an object having a top portion, and a base portion, with at least one surface therebetween, said object being positioned on said base portion thereof, providing a direct projection oriented image mask pattern in a portion of said mask assembly the light through which is focused by said lens on said top portion of said object, and simultaneously providing at least one reflected projection oriented image mask pattern in another portion of said mask assembly the light through which is focused by said lens on other than said top portion of said object.

* * * * *